(12) United States Patent
Honda

(10) Patent No.: US 6,750,676 B1
(45) Date of Patent: Jun. 15, 2004

(54) DRIVING CIRCUIT

(75) Inventor: Norifumi Honda, Sekizono Oita-Pref. (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/308,839

(22) Filed: Dec. 3, 2002

(30) Foreign Application Priority Data

Dec. 19, 2001 (JP) ........................................ 2001-386091

(51) Int. Cl.[7] ........................................ H03K 19/0175
(52) U.S. Cl. ............................ 326/81; 326/63; 326/86; 327/333
(58) Field of Search ............................ 326/62, 63, 81, 326/83, 86; 327/333

(56) References Cited

U.S. PATENT DOCUMENTS

| | | | | |
|---|---|---|---|---|
| 3,916,430 A | * | 10/1975 | Heuner et al. | 257/299 |
| 4,039,862 A | * | 8/1977 | Dingwall et al. | 327/333 |
| 6,049,228 A | * | 4/2000 | Moon | 326/81 |
| 6,285,233 B1 | * | 9/2001 | Ribellino et al. | 327/333 |
| 6,307,398 B2 | * | 10/2001 | Merritt et al. | 326/81 |

* cited by examiner

*Primary Examiner*—Michael Tokar
*Assistant Examiner*—Khai M Nguyen
(74) *Attorney, Agent, or Firm*—W. Daniel Swayze, Jr.; W. James Brady; Frederick J. Telecky, Jr.

(57) ABSTRACT

A driving circuit reduces fall delay time, and the output timing of a driving current can be controlled highly accurately while reducing ringing during a transition of output current. Because transistor QN4 diode-connected to node ND3 and resistor element R1 are connected in parallel at driver part 30, transistor QN4 becomes conductive first as voltage $V_g$ of node ND3 falls according to input signal $S_{in}$, and in accordance with a time constant based on combined resistance including its on-resistance and the resistance value of resistor element R1 voltage $V_g$ begins to drop suddenly, and when voltage $V_g$ becomes lower than the threshold voltage of transistor QN4, transistor QN4 becomes disconnected, and voltage Vg starts to drop slowly in accordance with a time constant based on the resistance value of resistor element R1, therefore the transitional characteristic in the fall of output current $I_H$ of current output transistor QN0 can be improved according to voltage $V_g$, and the fall delay time can be reduced, so that the timing of current $I_H$ can be controlled easily.

6 Claims, 4 Drawing Sheets

DRIVING CIRCUIT

FIELD OF THE INVENTION

The present invention pertains to a driving circuit, for example, a current output type driving circuit used in a bubble jet printer for supplying a driving current to heat a printer head part.

BACKGROUND OF THE INVENTION

At a head part of a bubble jet printer, a current is supplied to a heater to generate heat, and bubbles of ink are created in the nozzle of the header part by the heat and sprayed onto a paper surface. Usually, a driver circuit is provided at the head part in order to supply the current to the heater. In the past, the driver circuit was configured using bipolar transistors.

FIG. 6 is an outlined diagram showing an example configuration of the driving circuit. As shown in the figure, the driver circuit is configured with input buffer 10, level conversion circuit 20, driver part 30, and current output part 40. In terms of normal operating speed, when the driving circuit shown in FIG. 6 is configured using CMOS transistors inferior to bipolar transistors, operating speed, in particular, specification of the output current characteristic at current output part 40, becomes important.

Ideally, it is desirable if the driving current supplied to the heater by the driving circuit can be controlled through the input of control signal $S_{in}$ without any distortion. That is, the waveform of the driving current supplied to the heater needs to match roughly the waveform of control signal $S_{in}$. However, when the driving circuit is actually configured using CMOS transistors, the waveform of the driving current output may differ from the waveform of input signal $S_{in}$ due to frequency characteristics and delay characteristics of the circuit.

FIG. 7 shows waveform diagrams showing example waveforms of input signal $S_{in}$ and driving current $I_H$ output from the driving circuit. As shown in the figure, rising time $t_R$, falling time $t_F$, rise delay time $t_{PLH}$, and fall delay time $t_{PHL}$ in the waveform of driving urrent $I_H$ are of important specifications.

Rising time $t_R$ refers to the time required for driving current $I_H$ to go from 10% to 90% of maximum current value $I_{Hmax}$, and falling time $t_F$ refers to the time required for driving current $I_H$ to fall from 90% to 10% of maximum current value $I_{Hmax}$. In addition, rise delay time $t_{PLH}$ refers to the time the rising edge of the driving current is delayed from the rising edge of input signal $S_{in}$, and fall delay time $t_{PHL}$ refers to the time the falling edge of the driving current is delayed from the falling edge of input signal $S_{in}$.

FIG. 8 shows drain-source voltage $V_{ds}$ and drain current $I_{ds}$ characteristics of current output MOS transistor $Q_H$ used for output part 40. The resistance of a MOS transistor when it is conductive, or so-called on-resistance, is determined by its gate-source voltage $V_g$, and the on-resistance of the MOS transistor depends only on its gate-source voltage $V_g$, not drain-source voltage $V_{ds}$, except in saturated regions. In addition, drain current $I_{ds}$ of the MOS transistor, that is, driving current $I_H$ supplied to load resistor R1, is determined based on source voltage $V_H$, load resistance value r1, and on-resistance $r_{ON}$ of the MOS transistor and is given by the following equation.

Equation 1

$$I_H = V_H/(r1 + r_{ON}) \quad (1)$$

The dotted line in FIG. 8 indicates the load characteristic of the heater connected to the drain of the MOS transistor. Here, assume that source voltage $V_H$ is 25V, and the resistance value of the heater is approximately 250Ω.

As shown in FIG. 8, driving current $I_H$ supplied to the heater changes from 0 mA to approximately 100 mA according to gate voltage $V_g$ of the transistor.

The characteristics of gate voltage $V_g$ of current output transistor $Q_H$ and output current $I_H$ thereof with respect to input signal $S_{in}$ can be obtained based on the output characteristic and load characteristic of the MOS transistor for current output.

FIG. 9 shows respective waveforms of input signal $S_{in}$, gate voltage $V_g$ of current output transistor $Q_H$, and driving current $I_H$. In addition, in FIG. 9, the relationship between rise delay time $t_{PLH}$ and fall delay time $t_{PHL}$ is also shown. As shown in FIG. 9, when the voltage is half the maximum value, for example, when the maximum value is the source voltage for input buffer 10, that is, $V_{dd}$=5V, at the rising edge of input signal $S_{in}$, rise delay time $t_{PLH}$ refers to the delay time from when it has reached half of said value, that is, 2.5V, until gate voltage $V_g$ of current output transistor $Q_H$ reaches 6V, for example. Furthermore, here, assume that the maximum value of gate voltage $V_g$ of transistor $Q_H$ is approximately equal to source voltage $V_H$, for example, 25V.

In addition, fall delay time $t_{PHL}$ refers to the time from when the voltage has reached half of maximum value $V_{dd}$, that is, 2.5V, at the falling edge of input signal $S_{in}$ until gate voltage $V_g$ of transistor $Q_H$ drops to 6V.

In addition, rise delay time $t_{PLH}$ is approximately equal to the delay time from when input signal $S_{in}$ has reached half the maximum value until driving current $I_H$ reaches half the maximum value. On the other hand, fall delay time $t_{PHL}$ is approximately equal to the delay time from when input signal $S_{in}$ has reached half the maximum value until driving current $I_H$ reaches half the maximum value.

As shown in the figure, the time required for gate voltage $V_g$ of current output transistor $Q_H$ to rise from 0V to 6V is less than the time required for gate voltage $V_g$ to fall from the maximum value of 25V to 6V. That is, fall delay time $t_{PHL}$ > rise delay time $t_{PLH}$.

Accordingly, when rising time $t_R$ and falling time $t_F$ of driving current $I_H$ to be output are made equal, fall delay time $t_{PHL}$ of driving current $I_H$ becomes longer than rise delay time $t_{PLH}$ with respect to input signal $S_{in}$. That is, the balance between the rise and the fall of driving current $I_H$ deteriorates, and pulse width $T_{W-IH}$ of driving current $I_H$ becomes greater than pulse width $T_{W-IN}$ of input signal $S_{in}$, so that driving current $I_H$ can no longer be controlled highly accurately.

The conventional driving circuit adopted a method that sets a short falling time in order to improve driving current controllability.

For example, as shown in FIG. 10, the times required for gate voltage $V_g$ of current output transistor $Q_H$ to start changing after input signal $S_{in}$ becomes half the maximum value at the rising edge and the falling edge of input signal $S_{in}$ are denoted as T11 and T21, respectively, and set as T11=T21=10 ns. Furthermore, rising time $T_R$ and falling time $T_F$ of driving current $I_H$ of transistor $Q_H$ are set as $T_R = T_F = 20$ ns.

As shown in FIG. 10, time T12 required for gate voltage $V_g$ to rise to 6V is roughly ¼ of rising time $T_R$, and time T22 required for gate voltage $V_g$ to fall from the maximum value of 25V to 6V is roughly ¾ of falling time $T_F$. That is, T12=5 ns, and T22=15 ns. Thus, rise delay time $T_{PLH}$ and fall delay time $T_{PHL}$ are obtained as follows, respectively. That is, $T_{PLH}$=T11+T12=15 ns, and $T_{PHL}$=T21+T22=25 ns. Accordingly, the difference between rise delay time $T_{PLH}$ and fall delay time $T_{PHL}$ is $T_{PLH}$-$T_{PHL}$=10 ns. For example, when pulse width $T_{w\text{-}in}$ of input signal $S_{in}$ is 100 ns, pulse width $T_{w\text{-}IH}$ of driving current $I_H$ becomes roughly 110 ns, creating a difference between the input and the output pulse widths, so that the timing of the driving current can not be controlled accurately.

Conventionally, a method for reducing falling time $T_F$ of driving current $I_H$ has been used in order to reduce fall delay time $T_{PHL}$. However, said method is disadvantageous in that not only the symmetry between rising time $T_R$ and falling time $T_F$ is destroyed, but ringing also increases as undershoot increases at the falling edge of driving current $I_H$ when falling time $T_F$ is too short.

The present invention was developed in light of such a situation, and its objective is to present a driving circuit by which the fall delay time can be reduced while reducing the ringing during a transition period of the output current, and the output timing of the driving current can be controlled highly accurately.

SUMMARY OF THE INVENTION

In order to achieve the aforementioned objective, the driving circuit of the present invention has a level conversion circuit which converts a first logical level signal into a second logical level signal having a higher logical amplitude than that of the aforementioned first logical level signal and a driver part which outputs a driving signal according to a signal output from the aforementioned level conversion circuit, wherein the aforementioned driver part has a first MOS transistor connected between a first power source potential and an output terminal, a second MOS transistor connected between the aforementioned output terminal and a second power source potential which becomes conductive to complement the aforementioned first MOS transistor, a first diode circuit connected between the aforementioned output terminal and the aforementioned second MOS transistor, and a first resistor connected in parallel with the aforementioned first diode circuit.

In addition, in the present invention, it is desirable when the aforementioned driver part has a second diode circuit connected between the aforementioned first MOS transistor and the aforementioned output terminal and a second resistor connected in parallel with the aforementioned second diode circuit.

In addition, it is desirable when the aforementioned first diode circuit has a third diode-connected MOS transistor, and when the aforementioned second diode circuit has a fourth diode-connected MOS transistor.

Furthermore, it is desirable when the aforementioned first MOS transistor is a PMOS transistor, and the aforementioned second and the third MOS transistors are nMOS transistors.

DESCRIPTION OF THE EMBODIMENTS

First Embodiment

Figure 1:
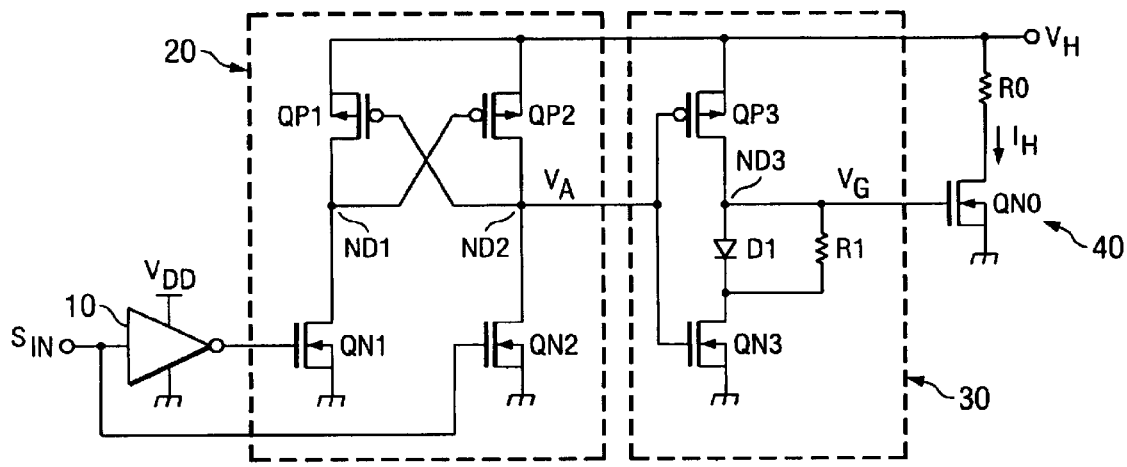
FIG. 1 is a circuit diagram showing a first embodiment of the driving circuit pertaining to the present invention.

FIG. 1 is a circuit diagram showing a first embodiment of the driving circuit pertaining to the present invention.

As shown in the figure, the driving circuit pertaining to the present invention is configured with input buffer 10, level conversion circuit 20, driver part 30, and current output part 40. Current output part 40 is provided with current output MOS transistor QN0, and load resistor R0 is connected to its drain.

The driving circuit of the present embodiment is provided at the head part of a bubble jet printer, for example, whereby heat is generated as a driving current is supplied to a heater to create bubbles at a nozzle of the printer in order to spray ink onto a paper surface. As shown in FIG. 1, driving current $I_H$ is supplied to the heater serving as a load by current output transistor QN0 when control signal $S_{in}$ is at a high level, for example, according to control signal $S_{in}$ input to input buffer 10.

The configurations of respective parts of the driving circuit of the present embodiment will be explained below in reference to FIG. 1.

Input buffer 10 is configured using an inverter, for example. Furthermore, in the driving circuit of the present embodiment, input buffer 10 operates at a low source voltage $V_{dd}$, for example, 5V, like a normal logic circuit part. On the other hand, because a high source voltage $V_H$, for example, a source voltage of 20–30V, is supplied to driving part 30 and load resistor R0, level conversion circuit 20 for signal level conversion is provided between input buffer 10 and driver part 30.

As shown in the figure, level conversion circuit 20 is configured with pMOS transistors OP1 and QP2 and nMOS transistors QN1 and QN2. The sources of transistors QP1 and QP2 are both connected to source voltage $V_H$, the gate of transistor QP1 is connected to the drain of transistor QP2, and the gate of transistor QP2 is connected to the drain of transistor QP1.

The drain of transistor QN1 is connected to the drain of transistor QP1, and the drain of transistor QN2 is connected to the drain of transistor QP2. The sources of transistors QN1 and QN2 are both grounded. In addition, a logically inverted signal of input signal $S_{in}$ is applied to the gate of transistor QN1, and input signal $S_{in}$ is applied to the gate of transistor QN2.

In level conversion circuit 20 having said configuration, a signal having amplitude $V_H$ is output according to input signal $S_{in}$ having amplitude $V_{dd}$.

For example, when input signal $S_{in}$ is at low level, transistor QN1 becomes conductive, and transistor QN2 becomes disconnected. At this time, because the junction of the drains of transistors QN1 and QP1, that is, node ND1, is held roughly at ground potential GND, transistor QP2 becomes conductive. As a result, the junction of the drains of transistors QN2 and QP2, that is, node ND2, is held roughly at the high level of source voltage $V_H$.

When input signal $S_{in}$ changes from low level to high level, transistor QN1 becomes disconnected, and transistor QN2 becomes conductive. Accordingly, because node ND2 is held at low level, and transistor QP1 becomes conductive, node ND1 is held at high level.

As described above, when input signal $S_{in}$ is at low level, node ND2 of level conversion circuit 20 is held at a high level equal to source voltage $V_H$. In contrast, when input signal $S_{in}$ is at high level, node ND2 of level conversion circuit 20 is held at a low level approximately equal to ground potential GND. Assuming that the voltage of node ND2 is $V_a$, signal $V_a$ having amplitude $V_H$ is obtained by level conversion circuit 20 according to input signal Sin having amplitude $V_{dd}$.

Next, the configuration of driver part 30 will be explained.

As shown in FIG. 1, driver part 30 is configured with pMOS transistor QP3, diode D1, resistor element R1, and nMOS transistor QN3. The source of transistor QP3 is connected to source voltage $V_H$, and its drain is connected to node ND3 serving as the output terminal of driver part 30.

Diode D1 and resistor element R1 are connected in parallel between node ND3 and the drain of transistor QN3.

The source of transistor QN3 is grounded.

Output signal $V_a$ from node ND2 of level conversion circuit 20 is applied to the gates of transistors QN3 and QP3.

That is, driver part 30 has a configuration in which diode D1 and resistor element R1 are connected in parallel between the drains of a pMOS transistor and an nMOS transistor with respect to a normal CMOS inverter.

Output signal $V_g$ from node ND3 serving as output terminal is controlled at driver part 30 according to input signal $V_a$. For example, because transistor QN3 becomes conductive, and transistor QP3 becomes disconnected when input signal $V_a$ is at high level, output signal $V_g$ is held at low level. On the other hand, because transistor QN3 becomes disconnected, and transistor QP3 becomes conductive when input signal $V_a$ is at low level, output signal $V_g$ is held at high level. However, in the case of driver part 30 of the present embodiment, because diode D1 and resistor element R1 are connected in parallel between the drains of transistors QP3 and QN3, the rising and fall characteristics of output signal $V_g$ are improved over the rising and fall characteristics of a normal CMOS inverter.

Operation of the driver part of the present embodiment will be explained in further detail below in reference to FIG. 2.

Figure 2:
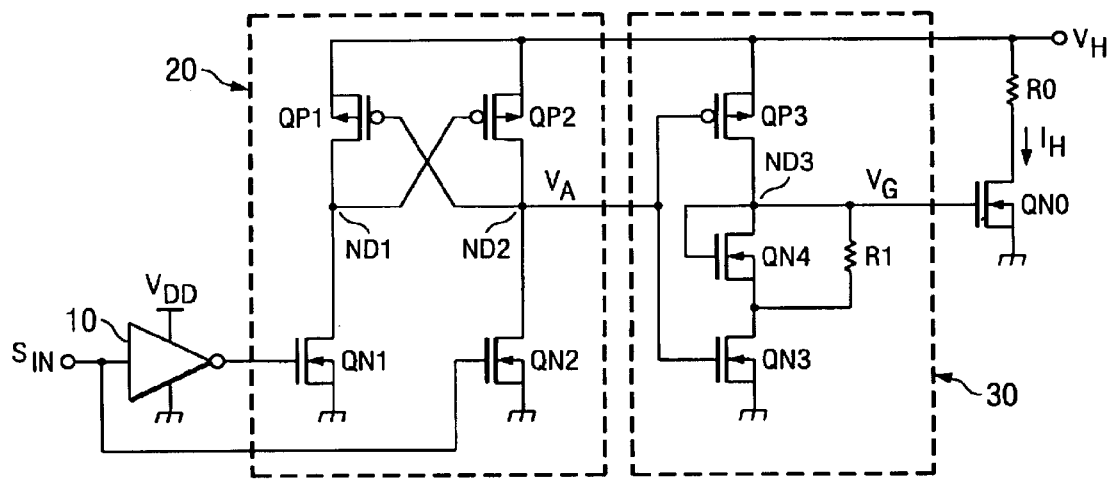
FIG. 2 is a circuit configuration showing a specific circuit configuration of the first embodiment of the driving circuit pertaining to the present invention.

FIG. 2 shows the circuit configuration when a diode is configured with nMOS transistor QN4 at driver part 30. As shown in the figure, the gate and drain of transistor QN4 are both connected to node ND3, and its source is connected to the drain of transistor QN3. That is, transistor QN4 is connected as a diode.

When diode-connected transistor QN4 and resistor element R1 connected in parallel with it are provided at driver part 30, and output signal $V_g$ of driver part 30 falls, its transition characteristics change. This point will be explained below in reference to FIG. 2.

First, assume that input signal $S_{in}$ is at low level. At this time, as described above, output signal $V_a$ of level conversion circuit 20 is held at high level. Thus, because transistor QP3 becomes disconnected, and transistor QN3 becomes conductive at driver part 30, output signal $V_g$ of driver part 30 is held at low level. At this time, transistor QN0 becomes disconnected at current output part 40, so that no driving current is output.

Next, when input signal $S_{in}$ switches from low level to high level, output signal $V_a$ of level conversion circuit 20 switches from high level to low level. Accordingly, transistor QP3 becomes conductive, and transistor QN3 becomes disconnected at driver part 30. At this time, voltage $V_g$ of node ND3 rises from ground potential GND according to a time constant determined based on the parasitic capacitance (including the gate capacitance of transistor QN0) of node D3 and the on-resistance of transistor QP3.

As voltage $V_g$ reaches threshold voltage $V_{thN}$ of current output transistor QN0, transistor QN0 becomes conductive, and driving current $I_H$ begins to flow into load resistor R0. Here, assuming that source voltage $V_H$ is 25V, the time required for output voltage $V_a$ of driver part 30 to go from 2V to 10V constitutes rising time $T_R$, and the time required from when input signal $S_{in}$ becomes half of source voltage $V_{dd}$, for example, 2.5V, until output voltage $V_a$ of driver part 30 reaches 6V constitutes rise delay time $T_{PLH}$.

Furthermore, if output voltage $V_a$ of driver part 30 exceeds 10V, current output transistor QN0 closely approaches its saturation region, so that the value of driving current $I_H$ hardly changes even when voltage $V_a$ rises further and is kept almost fixed. For example, assuming that the resistance value of load resistor R0 is 250Ω, driving current $I_H$ then is roughly 100 mA.

Next, as input signal $S_{in}$ switches from high level to low level, output signal $V_a$ of level conversion circuit 20 switches from low level to high level accordingly. At driver part 30, transistor QP3 becomes disconnected, and transistor QN3 becomes conductive.

At this time, the gate-source voltage of transistor QN4 is determined based on output voltage $V_g$ of driver part 30. Immediately after transistor QN3 becomes conductive, the gate-source voltage of transistor QN4 is approximately equal to source voltage $V_H$, transistor QN4 becomes conductive, and its on-resistance decreases. At this time, voltage $V_g$ of node ND3 drops in accordance with a time constant determined based on a combined resistance comprising the parasitic capacitance of node ND3, the on-resistance of transistor QN4, and resistor element R1. In addition, as voltage $V_g$ drops, output current $I_H$ of current output transistor QN0 drops suddenly.

When potential $V_g$ of node ND3 drops, the gate-source voltage of transistor QN4 also drops, and its on-resistance increases. Then, when voltage $V_g$ becomes lower than the threshold voltage of transistor QN4, transistor QN4 becomes disconnected. At this time, voltage $V_g$ of node ND3 drops in accordance with a time constant determined based on the resistance value of resistor element R1 connected in parallel with transistor QN4 and the parasitic capacitance of node ND3. Because the resistance value of resistor element R1 is usually set greater than the on-resistance of transistor QN4, the time constant becomes greater. Thus, potential $V_g$ of node ND3 drops slowly after transistor QN4 is disconnected. Accordingly, output current $I_H$ of current output transistor QN0 also drops slowly, and falling time $T_F$ of current $I_H$ increases.

As described above, transistor QN4 diode-connected to driver part 30 and resistor element R1 connected in parallel with it are provided in the present embodiment, whereby as output voltage $V_g$ of the driver part switches from high level to low level according to input signal $S_{in}$, transistor QN4 becomes conductive first, voltage $V_g$ drops suddenly in accordance with a time constant determined based on a combined resistance comprising its low on-resistance and the resistance value of resistor element R1, and voltage $V_g$ becomes lower than the threshold voltage of transistor QN4, transistor QN4 becomes disconnected, and its resistance increases, so that voltage $V_g$ drops slowly in accordance with a time constant determined based roughly on the resistance value of resistor element R1. Accordingly, output current $I_H$ Of output transistor QN0 also drops suddenly, and current $I_H$ drops slowly after transistor QN4 is disconnected.

Thus, fall delay time $T_{PHL}$ of the driving current supplied to load resistor R0 becomes shorter than that in the past, so that driving current $I_H$ can be supplied to the load resistor using almost the same pulse width as that of input signal $S_{in}$. Furthermore, because driving current $I_H$ drops slowly until it reaches 0 during the latter half of the fall, occurrence of ringing can be prevented, and a stable driving current can be supplied to the load resistor.

Figure 3:
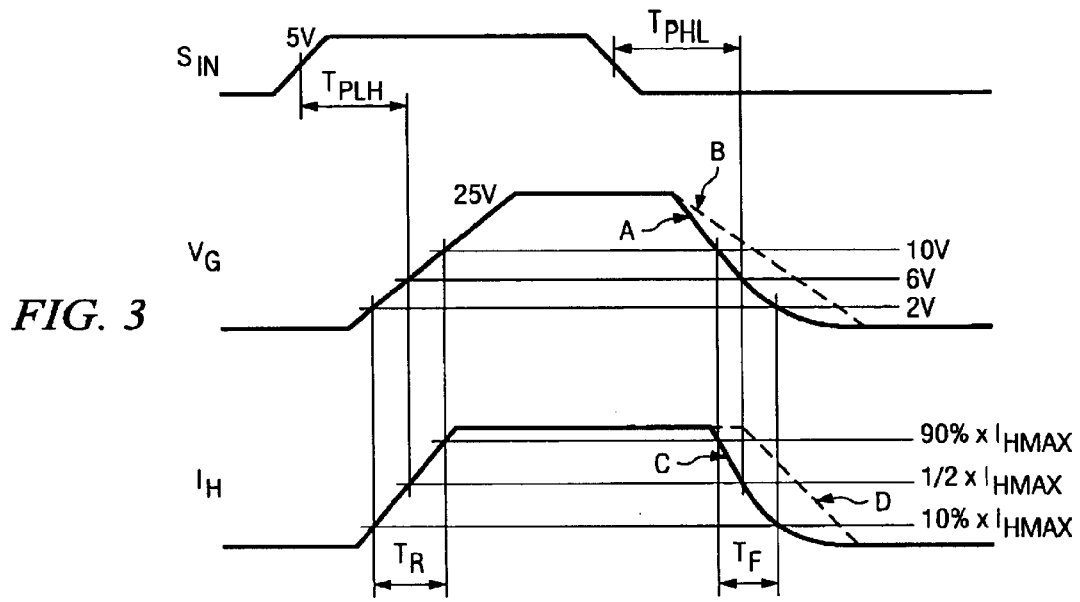
FIG. 3 displays waveform diagrams showing operation of the first embodiment of the present invention.

FIG. 3 shows waveform diagrams showing the operation of the driving circuit of the present embodiment. FIGS. 3 (a), (b), and (c) show waveforms of input signal $S_{in}$, output signal $V_g$ of driver part 30, and driving current $I_H$, respectively. Furthermore, in FIGS. 3 (b) and (c), output signal $V_g$ of the driver part and driving current $I_H$ of a conventional driving circuit are also shown for the sake of comparison (waveform B in FIG. 3 (b) and waveform D in FIG. 3 (c)). In FIGS. 3 (b) and (c), curves A and C indicated by solid lines shows respective waveforms of output voltage $V_g$ of driver part 30 of the driving circuit and output current $I_H$ of current output part 40 of the present embodiment.

As shown in FIG. 3, output voltage $V_g$ of driver part 30 also rises in response to the rise of input signal $S_{in}$, and driving current $I_H$ begins to be supplied by current output transistor QN0. When input signal $S_{in}$ falls, output $V_g$ of driver part 30 also drops accordingly. At this time, as shown in FIG. 3 (b), because transistor QN4 at driver part 30 becomes conductive, voltage $V_g$ drops suddenly in accordance with a time constant based on a combined resistance comprising its on-resistance and the resistance value of resistor element R1. Then, when voltage $V_g$ becomes lower than the threshold voltage of transistor QN4, transistor QN4 becomes disconnected, and its resistance increases, so that voltage $V_g$ drops slowly in accordance with a time constant based on the resistance value of resistor element R1 connected in parallel with transistor QN4. As shown in FIG. 3 (c), output current $I_H$ of current output transistor QN0 drops suddenly first, and current $I_H$ drops slowly as transistor QN4 gets disconnected according to the condition of the change in output voltage $V_g$ of driver part 30.

Thus, rise delay time $T_{PHL}$ of driving current $I_H$ supplied to the load resistor is shortened as compared to a conventional driving circuit, and driving current $I_H$ having almost the same pulse width as that of input signal $S_{in}$ can be obtained, so that the timing of the driving current can be controlled easily.

As described above, in the driving circuit of the present embodiment, transistor QN4 diode-connected to output node ND3 at driver part 30 and resistor element R1 are connected in parallel, whereby when potential $V_g$ of output node ND3 drops according to input signal $S_{in}$, transistor QN4 becomes conductive first, and potential $V_g$ of node ND3 drops suddenly in accordance with a time constant based on its low on-resistance. Then, when potential $V_g$ becomes lower than the threshold voltage of transistor QN4, transistor QN4 becomes disconnected, and potential $V_g$ drops slowly in accordance with a time constant based on the resistance value of resistor element R1. Because driving current $I_H$ supplied to the load resistor switches from a sudden drop to a slow drop accordingly as transistor QN4 becomes disconnected, the fall delay time can be reduced as compared to that of a conventional driving circuit, the difference in delay time between the rise and fall can be reduced, a stable driving current can be supplied to the load resistor, and the timing of the driving current can be controlled easily.

Second Embodiment

Figure 4:
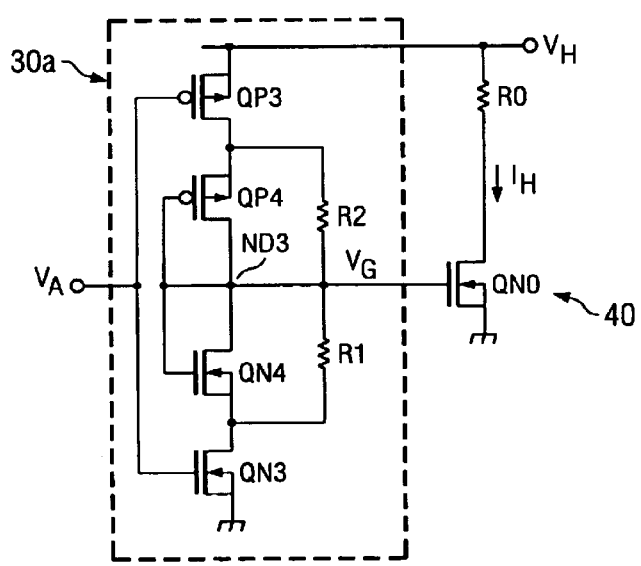
FIG. 4 is a circuit diagram showing a second embodiment of the driving circuit pertaining to the present invention.

FIG. 4 is a partial circuit diagram showing a second embodiment of the driving circuit pertaining to the present invention, wherein the partial circuit diagram shows the configuration of driver part 30a and current output part 40.

Furthermore, in the present embodiment, driver part 30a is provided with PMOS transistor QP4 and resistor element R2 in addition to those in the aforementioned first application example.

As shown in FIG. 4, transistor QP4 is diode-connected. That is, the source of transistor QP4 is connected to the drain of transistor QP3, and its gate and the drain are both connected to node ND3 serving as output terminal for driver part 30a. In addition, resistor element R2 is connected in parallel with transistor QP4.

Output signal $V_a$ from level conversion circuit 20 is applied to the gates of transistors QP3 and QN3. As described in the aforementioned first embodiment, when input signal $S_{in}$ is at high level, low-level signal $V_a$ is output from level conversion circuit 20. In contrast, when input signal $S_{in}$ is at low level, high-level signal $V_a$ is output from level conversion circuit 20.

In the driving circuit of the present embodiment, the output characteristic at the rising edge and the falling edge of output voltage $V_g$ of node ND3 is controlled by adding transistor QN4 diode-connected at driver part 30a, resistor element R1, and transistors QP4 and R2.

Operation of driver part 30a and current output part 40 in the present embodiment will be explained in reference to FIG. 4.

Because transistor QP3 becomes disconnected, and transistor QN3 becomes conductive at driver part 30a when output signal $V_a$ from level conversion circuit 20 is at high level, node ND3 is kept at low level. Furthermore, at this time, because transistor QN0 becomes disconnected at current output part 40, driving current $I_H$ is not output.

Next, as output signal $V_a$ of level conversion circuit 20 changes from high level to low level corresponding to input signal $S_{in}$, transistor QP3 becomes conductive, and transistor QN3 becomes disconnected accordingly at driver part 30a. Because a voltage roughly equivalent to $-V_H$ is applied between the gate and the source of transistor QP4 first, transistor QP4 becomes conductive, and its on-resistance decreases. At this time, voltage $V_g$ of node ND3 increases suddenly in accordance with a time constant determined based on a combined resistance comprising the on-resistance of transistor QP4 and the resistance value of resistor element R2 and the parasitic capacitance of node ND3.

Then, when differential voltage $V_H - V_g$ with respect to source voltage $V_H$ becomes lower than the absolute value of the threshold voltage of transistor QP4 as voltage $V_g$ of node ND3 further increases, transistor QP4 becomes disconnected. Thus, the resistance of transistor QP4 increases. At this time, voltage $V_g$ of node ND3 increases slowly in accordance with a time constant determined based on the resistance value of resistor element R2 and the parasitic capacitance of node ND3 and finally reaches source voltage $V_H$ level.

As described above, in the present embodiment, transistor QP4 diode-connected between output node ND3 of driver part 30a and the drain of transistor QP3, and resistor element R2 connected in parallel with it are provided, whereby because transistor QP4 becomes conductive first as voltage $V_g$ of node ND3 rises according to input signal $S_{in}$, voltage $V_g$ increases suddenly in accordance with a time constant based on a combined resistance comprising its on-resistance and the resistance value of resistor element R2, transistor QP4 becomes disconnected as difference $V_H$—$V_g$ between source voltage $V_H$ and voltage $V_g$ of node ND3 becomes lower than the absolute value of the threshold voltage transistor QP4 becomes disconnected, and voltage $V_g$ rises slowly in accordance with a time constant based on the resistance value of resistor element R2. Accordingly, because output current $I_H$ increases suddenly and then increases slowly as transistor QP4 becomes disconnected at current output transistor QN0, the rise delay time of current $I_H$ can be reduced. In addition, because current $I_H$ increases slowly, the occurrence of ringing can be prevented, and the stability of driving current $I_H$ can be improved.

Next, as output signal $V_a$ of level conversion circuit 20 switches from low level to high level according to input signal $S_{in}$, transistor QP3 becomes disconnected, and transistor QN3 becomes conductive at driver part 30a accordingly. Because voltage V roughly equivalent to source voltage $V_H$ is applied initially between the gate and the source of transistor QN4, transistor QN4 becomes conductive, and its on-resistance decreases. At this time, voltage $V_g$ of node ND3 drops suddenly in accordance with a time constant determined based on a combined resistance comprising the on-resistance of transistor QN4 and the resistance value of resistor element R1 and the parasitic capacitance of node ND3.

Then, as voltage $V_g$ of node ND3 drops to the threshold voltage of transistor QN4, transistor QN4 becomes disconnected. Thus, the resistance of transistor QP4 increases. At this time, voltage $V_g$ of node ND3 drops slowly in accordance with a time constant determined based on the resistance value of resistor element R1 and the parasitic capacitance of node ND3 and finally reaches ground potential GND.

As described above, in the present embodiment, transistor QN4 diode-connected between node ND3 and the drain of transistor QN3, and resistor element R1 connected in parallel with it are provided in the same manner as described in the aforementioned first embodiment for driving part 30a, whereby transistor QN4 becomes conductive first as voltage $V_g$ of node ND3 falls according to input signal $S_{in}$ and then voltage $V_g$ drops suddenly in accordance with a time constant based on a combined resistance comprising its on-resistance and the resistance value of resistor element R1. Then, as voltage $V_g$ drops below the threshold voltage of transistor QN4, transistor QN4 becomes disconnected, and voltage $V_g$ drops slowly in accordance with a time constant based on the resistance value of resistor element R1. Because output current $I_H$ of current output transistor QN0 also drops suddenly accordingly in the beginning, and output current $I_H$ drops slowly as transistor QN4 becomes disconnected, occurrence of ringing can be prevented, and the fall delay time can be reduced.

As explained above, the rise delay time and the fall delay time of driving current $I_H$ output from current output part 40 can both be regulated through the provision of transistors QN4 and QP4 and resistor elements R1 and R2 at driver part 30a of the driving circuit of the present embodiment. For example, the rise delay time of driving current $I_H$ can be controlled by setting the on-resistance of transistor QP4 appropriately. Similarly, the fall delay time of driving current $I_H$ can be controlled by setting the on-resistance of transistor QN4 appropriately. Accordingly, the timing of driving current $I_H$ output according to control signal $S_{in}$ can be controlled highly accurately. In addition, because occurrence of ringing can be prevented at the rise and the fall, the stability of driving current $I_H$ can be improved.

Third Embodiment

Figure 5:
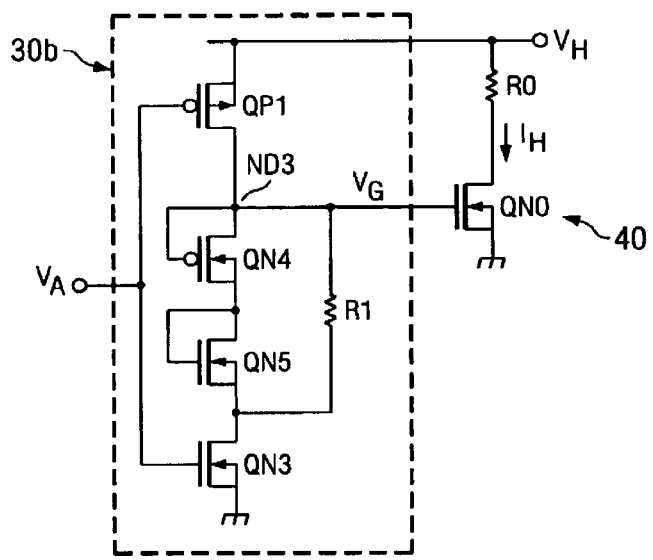
FIG. 5 is a circuit diagram showing a third embodiment of the driving circuit pertaining to the present invention.
Figure 6:
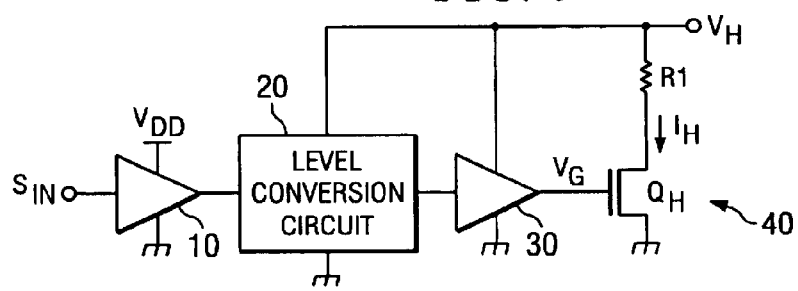
FIG. 6 is a block diagram showing the configuration of the current driving circuit of a nozzle heater in a popular bubble jet printer.
Figure 7:
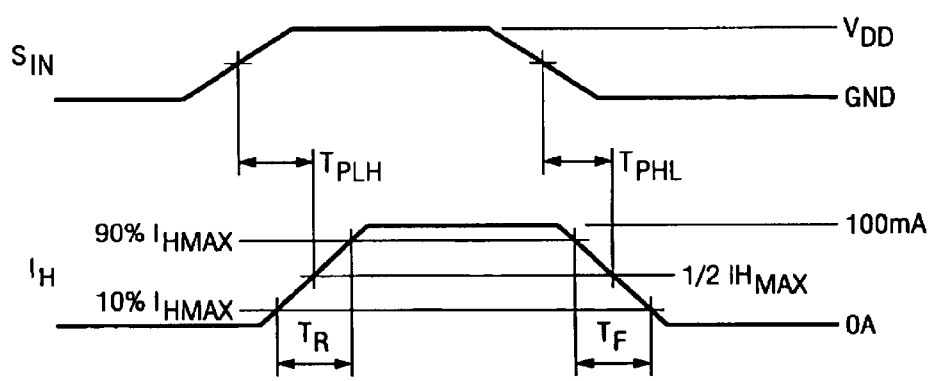
FIG. 7 displays schematic diagrams showing specifications of the control signal and the driving signal of a driving circuit.
Figure 8:
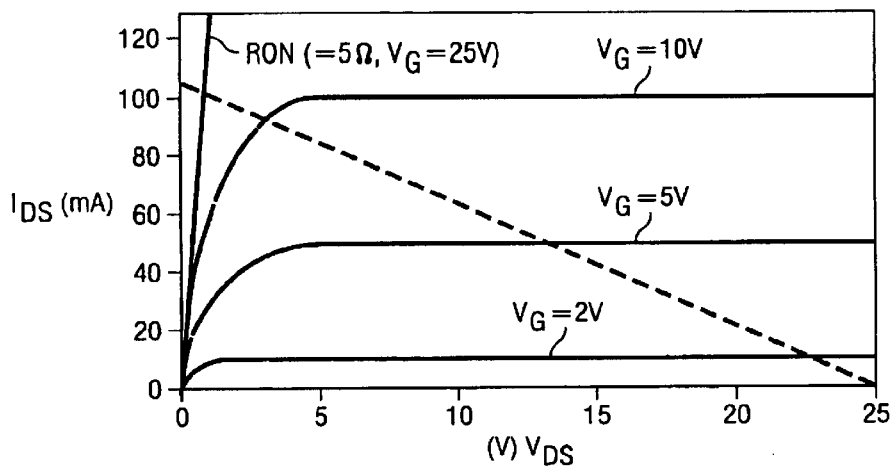
FIG. 8 is a diagram showing the output characteristic of a current output MOS transistor.
Figure 9:
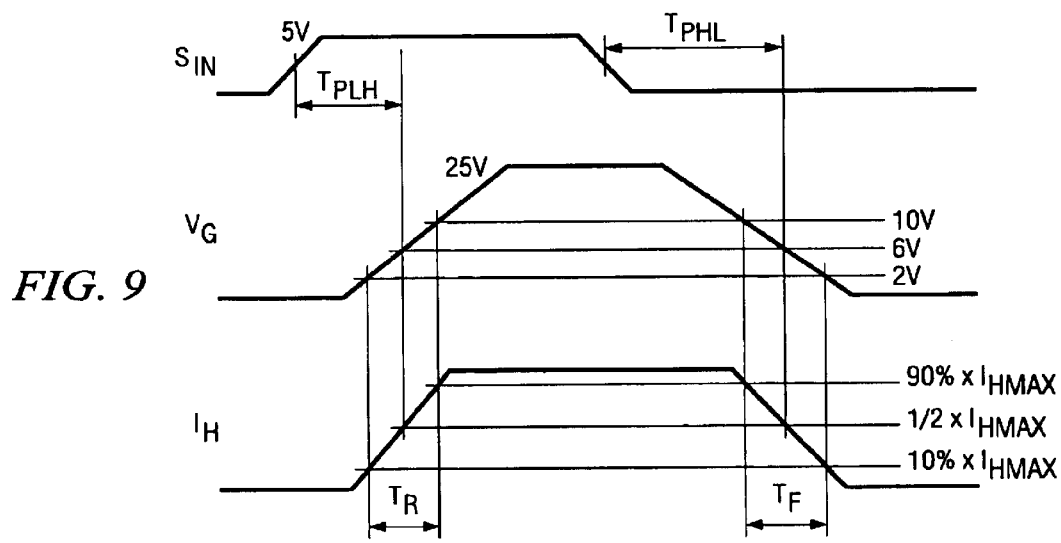
FIG. 9 displays diagrams showing the waveforms of voltage applied to the gate of a current output transistor and its output current.
Figure 10:
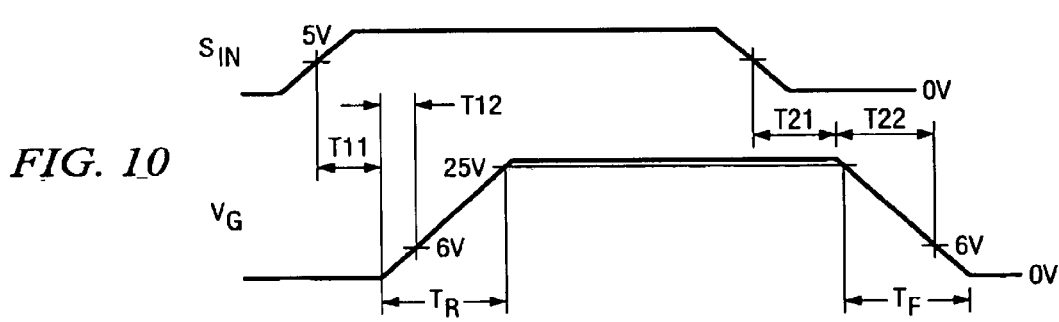
FIG. 10 displays diagrams showing an example rise delay time and fall delay time of driving current with respect to the control signal.

FIG. 5 is a partial circuit diagram showing a third embodiment of the driving circuit pertaining to the present invention, wherein the circuit diagram shows the configuration of driver part 30b and current output part 40.

As shown in the figure, in the present embodiment, transistors QN4 and QN5 are connected in series between node ND3 and the drain of transistor QN3 at driver part 30b. In addition, resistor element R1 is connected in parallel with said series circuit.

As shown in FIG. 5, the gate and the drain of transistor QN4 are connected to node ND3, and the gate and the drain of transistor QN5 are connected to the source of transistor QN4. Resistor element R1 is connected between node ND3 and the source of transistor QN5.

In the present embodiment, because diode-connected transistors QN4 and QN5 are connected in series at driver part 30b, when voltage $V_g$ of node ND3 falls, the falling condition of voltage $V_g$ can be regulated, so that the range of voltage controlled can be expanded. Operation associated with the fall of voltage $V_g$ will be explained below.

As output signal $V_a$ of not-illustrated level conversion circuit 20 switches from the low-level to high level according to input signal $S_{in}$, output voltage $V_g$ of driver part 30b switches from high level to low level accordingly. At this time, because transistors QN4 and QN5 both become conductive first, voltage $V_g$ of node ND3 drops suddenly in accordance with a time constant determined based on a combined resistance comprising the sum of the on-resistances of transistors QN4 and QN5 and the resistance value of resistor element R1, and the parasitic capacitance of node ND3.

Then, as voltage $V_g$ reaches the total of the values of the threshold voltages of transistors QN4 and QN5, transistors QN4 and ON5 become disconnected. At this time, because the resistances of transistors QN4 and QN5 increase, voltage $V_g$ of node ND3 begins to drop slowly in accordance with a time constant determined based on the resistance value of resistor element R1 and the parasitic capacitance of node 3.

As described above, as far as falling of output voltage $V_g$ of driver part 30b is concerned, the timing for voltage $V_g$ to change from sudden dropping to slow dropping can be regulated by connecting diode-connected transistors QN4 and QN5 in series at driver part 30b of the present embodiment. Because the same timing regulation is performed also at the fall of output current $I_H$ at current output part 40 accordingly, the fall delay time of driving current $I_H$ can be controlled more finely than the aforementioned first and the second embodiments.

Furthermore, although a circuit configuration involving two-stage transistors diode-connected between node ND3 and the drain of transistor QN3 at driver part 30b was shown in the aforementioned third embodiment, the present invention is not limited to said configuration, and diode-connected transistors may also be connected in 2 or more stages in order to control the fall characteristic. Furthermore, two-stage diode-connected transistors may be connected in 2 or more stages between node ND3 and the drain of transistor QP3 in order to control the rise characteristic more finely.

As explained above, in the driving circuit of the present invention, because the diode-connected transistors and resistor elements are connected in parallel at the driver part which generates the gate voltage of the current output transistor, transitional characteristics of the driving current during the rise and fall can be improved, balance between the rise delay time and the fall delay time with respect to the control signal can be maintained, and the output timing of the driving current can be controlled easily.

In addition, with the present invention, occurrence of ringing during transition of the driving current can be prevented, and the stability of the driving current can be improved.

Furthermore, in the present invention, unlike a normal CMOS inverter, because a diode-connected transistor and resistor element are connected in parallel between a PMOS transistor and nMOS transistor at the driver part, the ON current can be controlled to be low when the output voltage switches, so that the power consumption can be reduced. In addition, unlike a normal CMOS inverter, because only diode-connected MOS transistors and resistor elements connected in parallel with them are added at the driver part of the present invention, advantageously the circuit configuration does not get complicated, and the layout is unlikely to be affected.

What is claimed is:

1. A power supply circuit, comprising:
    a level conversion circuit which converts a first logical level signal into a second logical level signal having a higher logical amplitude than that of the said first logical level signal and a driver part which outputs a driving signal according to a signal output from the said level conversion circuit, wherein
    said driver part includes:
        a first MOS transistor connected between a first power source potential and an output terminal,
        a second MOS transistor connected between said output terminal and a second power source potential which becomes conductive to complement-said first MOS transistor,
        a first diode circuit connected between said output terminal and the said second MOS transistor, and
        a first resistor connected in parallel with said first diode circuit.

2. The power supply circuit described under claim 1, wherein,
    said driver part has a second diode circuit connected between said first MOS transistor and said output terminal and a second resistor connected in parallel with said second diode circuit.

3. The power supply circuit described under claim 1, wherein,
    said first diode circuit has a third diode-connected MOS transistor.

4. The power supply circuit described under claim 3, wherein,
    said second diode circuit has a fourth diode-connected MOS transistor.

5. The power supply circuit described under claim 3, wherein,
    said first MOS transistor is a PMOS transistor, and said second and the third MOS transistors are nMOS transistors.

6. The power supply circuit described under claim 1, wherein,
    said first diode circuit has multiple diode-connected MOS transistors.

* * * * *